United States Patent
Kawasaki et al.

(10) Patent No.: US 10,780,531 B2
(45) Date of Patent: Sep. 22, 2020

(54) SOLDER BALL, SOLDER JOINT, AND JOINING METHOD

(71) Applicant: Senju Metal Industry Co., Ltd., Tokyo (JP)

(72) Inventors: Hiroyoshi Kawasaki, Tokyo (JP); Yuri Nakamura, Tochigi (JP); Osamu Munekata, Tochigi (JP); Kaichi Tsuruta, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 16/677,011

(22) Filed: Nov. 7, 2019

(65) Prior Publication Data

US 2020/0147732 A1    May 14, 2020

(30) Foreign Application Priority Data

Nov. 9, 2018 (JP) .................. 2018-211535

(51) Int. Cl.
| | | |
|---|---|---|
| *B23K 35/00* | (2006.01) | |
| *B23K 35/26* | (2006.01) | |
| *C22C 13/00* | (2006.01) | |
| *B23K 35/02* | (2006.01) | |
| *B23K 101/42* | (2006.01) | |
| *H01L 23/00* | (2006.01) | |

(52) U.S. Cl.
CPC ........ *B23K 35/262* (2013.01); *B23K 35/0244* (2013.01); *C22C 13/00* (2013.01); *B23K 2101/42* (2018.08); *H01L 24/13* (2013.01); *H01L 24/85* (2013.01); *H01L 2224/13014* (2013.01); *H01L 2224/13109* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/85801* (2013.01); *H01L 2924/014* (2013.01)

(58) Field of Classification Search
CPC .... H01L 2224/45147; H01L 2924/014; B23K 35/0244; B23K 35/302; B23K 35/025; B23K 35/00; B23K 35/22; B23K 35/26; B23K 35/262; B23K 35/3006; B23K 35/3033; B23K 35/3046; B23K 35/365
See application file for complete search history.

(56) References Cited

U.S. PATENT DOCUMENTS

| | | | | |
|---|---|---|---|---|
| 2009/0298228 | A1* | 12/2009 | Sato | .................... H01L 21/6835 438/108 |
| 2013/0327444 | A1 | 12/2013 | Sawamura et al. | |
| 2014/0010705 | A1* | 1/2014 | Kanou | .................... H01L 24/43 420/491 |
| 2015/0217409 | A1* | 8/2015 | Akagawa | ................. H01B 1/02 174/126.2 |
| 2015/0228872 | A1* | 8/2015 | Nagano | ................. H01L 25/167 257/98 |
| 2017/0246711 | A1* | 8/2017 | Kawasaki | ................. B22F 1/02 |
| 2017/0252871 | A1* | 9/2017 | Kawasaki | ............. B23K 35/26 |
| 2017/0312860 | A1 | 11/2017 | Hattori et al. | |

FOREIGN PATENT DOCUMENTS

| | | |
|---|---|---|
| JP | 2004261863 A | 9/2004 |
| JP | 2009226481 A | 10/2009 |
| JP | 2013252548 A | 12/2013 |
| JP | 201834162 A | 3/2018 |
| WO | 2005089999 A1 | 9/2005 |
| WO | 2016071971 A1 | 5/2016 |

OTHER PUBLICATIONS

Shohji, et al., "Growth Kinetics of Intermetallic Compounds on the Boundary between Au and In—Sn Alloys", 1999, p. 121-126, vol. 2, No. 2.

\* cited by examiner

*Primary Examiner* — Erin B Saad
(74) *Attorney, Agent, or Firm* — The Webb Law Firm

(57) ABSTRACT

A solder ball includes 0.1% by mass or more and 10% by mass or less of In and a remainder of Sn. The ball has a yellowness (b\*) in an L\*a\*b\* color system of 2.8 or more and 15.0 or less and a lightness (L\*) of 60 or more and 100 or less. The ball further includes at least one element selected from a group of 0% by mass or more and 4% by mass or less of Ag, 0% by mass or more and 1.0% by mass or less of Cu, 0% to 3% by mass in total of Bi and/or Sb, and 0% to 0.1% by mass in total of an element selected from a group of Ni, Co, Fe, Ge, and P, excluding a solder ball including 3% by mass of Ag, 0.5% by mass of Cu, 0.2% by mass of In and a remainder of Sn.

6 Claims, No Drawings

SOLDER BALL, SOLDER JOINT, AND JOINING METHOD

CROSS-REFERENCE TO RELATED APPLICATION

This application claims priority to Japanese Patent Application No. 2018-211535 filed Nov. 9, 2018, the disclosure of which is hereby incorporated by reference in its entirety.

BACKGROUND OF THE INVENTION

Field of the Invention

The present invention relates to a solder ball, a solder joint, and a joining method.

Description of Related Art

With recent miniaturization and high-density mounting of electronic components, when mounting the electronic component(s) on a printed circuit board or the like, ball grid array (BGA) and chip size package (CSP) techniques have been used. As a composition of a solder alloy used for soldering the electronic component(s), Sn—In-based lead-free solder is exemplified. It is known that the Sn—In-based lead-free solder provides various effects due to the addition of a predetermined amount of In into Sn.

SUMMARY OF THE INVENTION

For example, when soldering the electronic component(s) on a surface of a Cu electrode that has been treated with Ni and Au sequentially, the diffusion rate of Au into Sn is extremely fast, so that Au plating disappears from a top of the electrode due to the diffusion of Au into Sn. Accordingly, there is an issue that the growth of intermetallic compounds (IMC) between Ni and Cu as the underlayer of Au and Sn in the lead-free solder may easily progresses. There is also an issue that the wettability of the lead-free solder may be reduced. A technology for delaying the diffusion rate of In into Sn by using Sn—In-based lead-free solder with an increased In content is disclosed.

However, the increase in amount of In, which is a rare metal, to be added in the Sn—In-based lead-free solder causes an excessive reduction in a melting point of solder in the Sn—In solder, which is a low-temperature solder. Therefore, an Sn—In-based lead-free solder material that can further exert the effect by virtue of the addition of In by adding a certain amount of In is desired.

The present invention addresses the above described issues and provides a solder ball, a solder joint and a joining method which can ensure solder wettability during solder joining without increasing the amount of In to be added in the Sn—In-based solder.

Concerning the solder ball obtained by improving an existing Sn—In-based lead-free solder alloy and processing the improved Sn—In-based lead-free solder alloy into a ball shape, the present inventors have found out that the diffusion of Au into the solder during solder joining can be suppressed by subjecting the solder ball itself to aging treatment such as heating, at a stage before joining the solder ball, to thereby form an oxide film in which the concentration of In enriched on the solder ball surface.

To addresses the above-described issues, a solder ball reflecting one aspect of the present invention contains 0.1% by mass or more and 10% by mass or less of In and a remainder of Sn, wherein the solder ball has a yellowness (b*) in an L*a*b* color system of 2.8 or more and 15.0 or less and a lightness (L*) in the L*a*b* color system of 60 or more and 100 or less and wherein the solder ball further includes at least one element selected from a group consisting of 0% by mass or more and 4% by mass or less of Ag, 0% by mass or more and 1.0% by mass or less of Cu, 0% to 3% by mass in total of an element selected from a group consisting of Bi and Sb, and 0% to 0.1% by mass in total of an element selected from a group consisting of Ni, Co, Fe, Ge, and P, provided that a solder ball including 3% by mass of Ag, 0.5% by mass of Cu, 0.2% by mass of In and a remainder of Sn is excluded.

In addition, as reflecting other aspects of the present invention, it is desired to provide a solder joint including the above-mentioned solder ball and a joining method including the steps of arranging a plurality of the above-mentioned solder balls on electrodes and melting the plurality of solder balls arranged on the electrodes using organic acid gas.

Other objects and attainments of the present invention will be become apparent to those skilled in the art upon a reading of the following detailed description.

DESCRIPTION OF THE PREFERRED EMBODIMENTS

The following will describe embodiments of a solder ball, a solder joint and a joining method according to embodiments of the present invention. Such description does not limit the technical scope, meaning of terms and the like in Claims.

The solder ball according to the present embodiment contains Sn as the main component and more than 0% by mass and 10% by mass or less of In, and has a yellowness (b*) in an L*a*b* color system of 2.8 or more and 15.0 or less. The solder ball also has a lightness (L*) in the L*a*b* color system of 60 or more and 100 or less, and a spherical diameter of 0.1 μm or more and 120 μm or less. Further, the solder ball according to the present embodiment has an oxide film having a predetermined thickness on its surface. The oxide film is formed by performing any aging treatment. Examples of the aging treatment include exposure to the atmosphere (standing) or heat treatment.

(1) In: More than 0% by Mass and 10.0% by Mass or Less

The content of In in the solder ball is more than 0% by mass and 10.0% by mass or less. By setting the In content to more than 0% by mass, a certain amount of In can be ensured, so that the diffusion of Au into the solder can be prevented. In addition, by setting the In content to 10.0% by mass or less, the growth of the oxide film can be suppressed within a certain range, so that the diffusion of Au into the solder can be prevented without reducing the wettability of the solder. Furthermore, by setting the In content within the above ranges, the In content can be reduced, so that the cost can be reduced. In addition, a preferable range of the In content is more than 0.1% by mass and 7.0% by mass or less, and a more preferable range thereof is 3.0% by mass or more and 7.0% by mass or less. The above content of In is realized by enrichment in the concentration of In through aging treatment.

(2) Spherical Diameter of Solder Ball: 0.1 μm or More and 120 μm or Less

The solder ball has a spherical diameter of 0.1 μm or more and 120 μm or less. This is because, if the spherical diameter of the solder ball exceeds 120 μm, it may be difficult to solder the solder balls with a fine pitch, so that it may be impossible to cope with the demand for the miniaturization of the substrate and the narrowing of the electrodes of the electronic components. The lower limit value is set to 0.1 μm or more, as the limit of the spherical diameter that can be technically used for solder bump formation. As described above, by setting the spherical diameter of the solder ball 10 within the range of 0.1 μm or more and 120 μm or less, it may be possible to cope with the miniaturization and high integration of the electronic components. Further, the advantageous effect of preventing the diffusion of Au into the solder described above is exerted as the particle size of the solder ball is reduced. Therefore, the spherical diameter of the solder ball is preferably 120 μm or less, more preferably 80 μm or less, further preferably 50 μm or less, most preferably 30 μm or less.

(3) Yellowness (b*) in L*a*b* Color System: 2.8 or More and 15.0 or Less

The yellowness (b*) in the L*a*b* color system of the solder ball is 2.8 or more and 15.0 or less. If the yellowness (b*) falls within the range of 2.8 or more and 15.0 or less, it is possible to effectively suppress the diffusion of Au into the solder during solder joining. When the solder ball is subjected to aging treatment at a predetermined temperature for a predetermined time, an oxide film containing a large amount of indium oxide such as $In_2O_3$ is formed on the solder ball surface, so that an enrichment phenomenon occurs in which the concentration of In on the solder ball surface increases. Even when the In content is as low as more than 0% by mass and 10.0% by mass as in the present embodiment, the concentration of In on the solder ball surface can be increased by intentionally oxidizing the solder ball surface, whereby the effect of suppressing the diffusion of Au into the solder can be obtained. Here, it is considered that, if the solder ball is excessively oxidized to increase the concentration of In on the solder ball surface, the effect of suppressing the diffusion of Au into the solder can be suppressed more effectively. However, in a solder ball having a spherical diameter of 120 μm or less, the influences of the oxide film are particularly great, thereby causing a problem of reduction in reliability during solder joining. Therefore, it is necessary to manage the oxide film thickness so as to satisfy both of the conditions for the oxide film thickness in consideration of the solderability and the conditions for the oxide film thickness in consideration of the effect of suppressing the diffusion of Au into the solder by enrichment in the concentration of In. Therefore, in the present embodiment, in order to manage the thickness of the oxide film formed on the solder ball surface simply and quickly, the yellowness (b*) in the L*a*b* color system is adopted, and a solder ball having a yellowness (b*) of 2.8 or more and 15.0 or less in the L*a*b* color system is produced, thereby realizing a solder ball having a predetermined oxide film thickness. When the yellowness (b*) is less than 2.8, In is not enriched, and the diffusion of Au into the solder may not be effectively suppressed during the formation of the solder bump. On the other hand, when the yellowness (b*) exceeds 15.0, the solder wettability during solder ball joining may be impaired, and the cost for the solder material increases. The yellowness (b*) is more preferably 7 or less.

(4) Lightness (L*) in L*a*b* Color System: 60 or More and 100 or Less

The solder ball has correlation such that, when the oxide film is thickened by the aging treatment, the yellowness (b*) in the L*a*b* color system increases, while the lightness (L*) in the L*a*b* color system lowers. Therefore, as a method of managing the thickness of the oxide film through the aging treatment of the solder ball, in addition to the yellowness (b*) in the L*a*b* color system as described above, the lightness (L*) in the L*a*b* color system can also be used as one index for managing the oxide film. The lightness (L*) in the L*a*b* color system of the solder ball is 60 or more and 100 or less. When the lightness (L*) is less than 60, the concentration of In is not enriched, and the diffusion of Au into the solder may not be effectively suppressed during the formation of the solder bump. On the other hand, when the lightness (L*) exceeds 100, the wettability of the solder during solder ball joining may be impaired. The upper limit of the lightness (L*) is more preferably 80 or less.

(5) Addition of at Least One Element of Ag: 0% by Mass or More and 4% by Mass or Less, Cu: 0% by Mass or More and 1.0% by Mass or Less; an Element Selected from a Group of Bi and Sb: 0% by Mass or More and 3% by Mass or Less in Total; and an Element Selected from a Group of Ni, Co, Fe, Ge and P: 0% by Mass or More and 0.1% by Mass or Less in Total The solder ball which constitutes the present invention contains Ag, Cu, Bi, In, Sb, Ni, Co, Fe, Ge, and/or P in the above-described ranges. Thus, the joining reliability can be improved. The contents of Ag, Cu, Bi, In, Ni, Sb, Co, Fe, Ge and/or P are preferably set: Ag: 0% by mass or more and 4% by mass or less; Cu: 0% by mass or more and 1.0% by mass or less; an element selected from a group of Bi and Sb: 0% by mass or more and 3% by mass or less in total; and an element selected from a group of Ni, Co, Fe, Ge and P: 0% by mass or more and 0.1% by mass or less in total, since a reaction between In and the joining member is not disturbed.

(6) Remainder: Sn

The remainder of the solder ball according to the present invention is Sn. That is, the main component of the solder ball is Sn, and the content thereof is always highest among the metal elements in the solder ball. In addition to the aforementioned elements, inevitable impurities may be contained. Even when the solder ball contains inevitable impurities, the above-described effects are not affected. Further, even if an element not contained in the present invention is contained as an inevitable impurity, the above-described effect is not affected.

(7) Alpha (α) Dose: 0.0200 cph/cm² or Less

The α dose of the solder ball according to the present invention is 0.0200 cph/cm² or less from the viewpoint of suppressing soft errors. This is an α dose such that soft errors would not become a problem in high-density mounting of the electronic components. The α dose is more preferably 0.0010 cph/cm² or less from the viewpoint of further suppressing soft errors in higher-density mounting.

(8) Method of Manufacturing Solder Ball

First, a solder ball having a spherical diameter of 0.1 μm or more and 120 μm or less and containing more than 0% by mass and 10.0% by mass or less of In is produced. As a method for producing the solder ball, a known method such as a dropping method in which a molten solder is dropped and processed into a spherical shape or a gas atomizing method can be adopted. One or more elements selected from a group of Ag, Cu, Bi, Ni, Sb, Co, Fe, Ge and P can be added to the solder ball.

Next, the produced solder ball is subjected to aging treatment to form an oxide film on the solder ball surface, thereby controlling the concentration of In on the solder ball surface so as to be high. In the aging treatment, the heating temperature and the heating time are set so as to attain an oxide film thickness such that the yellowness (b*) of the solder ball is 2.8 or more and 15.0 or less. Also, as other methods of controlling the concentration of In so as to be high, there are indicated: storing the solder ball in a state of being exposed to the atmosphere at room temperature for a long time; aging by increasing the oxygen concentration during ball formation; and oxygen plasma irradiation at least either during ball formation or after ball formation. Thus, it is possible to produce a solder ball in which an oxide film having a certain thickness is formed on its surface.

According to the solder ball according to the present embodiment, for example, even when using the solder ball for an electrode containing Au, it is possible for the oxide film formed on the solder ball surface to suppress the diffusion of Au into the solder without increasing the amount of In to be added and to prevent the deterioration in wettability of the solder during solder joining. In addition, since the amount of In to be added to Sn is suppressed, it is possible to prevent the melting point of the solder from being excessively reduced.

The solder ball according to the present invention can also be used to form a solder joint for joining electrodes. In the present invention, for example, a structure in which a solder bump is mounted on an electrode of a printed circuit board is referred to as a solder joint. The solder bump means, for example, a structure in which a solder ball is mounted on an electrode of a semiconductor chip.

The solder ball according to the present invention can also be applied to a joining method without using any flux. For example, each of the plurality of solder balls, which is subjected to aging treatment, is arranged on an electrode of a substrate, and then the plurality of solder balls arranged thereon are melted using any organic acid gas, thereby forming a solder bump. As the solder balls, used were 50 solder balls of which the arithmetic mean of the measured diameter values was 120 μm. Even in this case, it is possible to suppress the diffusion of Au into the solder effectively.

Executed Examples

First, Sn—In solder balls each having a spherical diameter of 120 μm and having the alloy composition shown in each of the Examples were prepared. Next, each of the prepared solder balls was subjected to aging treatment in advance under different conditions, and the surface of each of the solder balls was intentionally oxidized to increase the concentration of In on the surface thereof, thereby preparing solder balls having formed thereon an oxide film containing a high concentration of indium oxide such as $In_2O_3$. Subsequently, the yellowness (b*), the lightness (L*), and the concentration of In on the surface in each of the solder balls were respectively measured.

(1) Measurement of Yellowness (b*) and Lightness (L*) of Solder Ball

The yellowness (b*) and lightness (L*) of the solder balls were measured using CM-2600d spectrophotometer manufactured by Konica Minolta, Inc.

(2) Measurement of Concentration of in on Surface of Each of Solder Balls

The concentration of In on the surface of each of the solder balls was analyzed qualitatively with a field emission electron probe microanalyzer (FE-EPMA), and a semi-quantitative analysis value was quoted. For the concentration of In on the surface of each of the solder balls, a semi-quantitative analysis value was calculated in order to make comparison in terms of the concentration change.

(3) Evaluation of Concentration of in on Surface of Each of Solder Balls

An Sn—In solder ball, which is not subjected to aging treatment, was prepared, and the enrichment in the concentration of In was evaluated by comparing the semi-quantitative analysis value of In in each of the solder balls each being subjected to aging treatment with the semi-quantitative analysis value of this solder ball, which is not subjected to aging treatment, as a reference.

(a) When the semi-quantitative analysis value of the solder ball of each of the Executed Examples or Comparative Examples exceeded the semi-quantitative analysis value of the reference solder ball: Such a solder ball was indicated as ○ (The concentration of In was highly enriched).

(b) When the semi-quantitative analysis value of the solder ball of each of the Executed Example or Comparative Example was equal to or less than the semi-quantitative analysis value of the reference solder ball: Such a solder ball was indicated as x (The concentration of In was insufficiently enriched).

(4) Evaluation of Solder Wettability

A Cu plate plated with Ni and Au sequentially was used. Flux WF-6400 (manufactured by Senju Metal Industry Co., Ltd.) was printed on the Cu plate, and each of the solder balls was mounted thereon. The temperature of the electrode pad on which the solder ball was mounted was increased from 25° C. to 250° C. in an $N_2$ atmosphere at a temperature increase rate of 5° C./sec, and then reflow soldering was performed for 1 minute. Such treatment was performed on 100 solder balls.

(a) When all of the 100 solder balls were wet-spread over in each of the entire electrode pads: Such a case was indicated as ○ (Good).

(b) When one or more solder balls did not wet-spread over in each of the entire electrode pads: Such a case was indicated as x (Unallowable)

Table 1 indicates the measurement results and evaluation results when the alloy composition was Sn-7% by mass In-3% by mass Ag-0.5% by mass Cu. The evaluation of the enrichment in the concentration of In in Table 1 was made based on the concentration of the solder ball, which was not subjected to aging treatment. In Table 1, the unit of In is mass %.

TABLE 1

| No. | Aging condition Temperature/ time | Alloy composition | Yellowness (b*) | Lightness (L*) | Semi- quantitatively analyzed In (mass %) | Enrichment of In | Wettability |
|---|---|---|---|---|---|---|---|
| Executed Example 1 | Normal temperature/ 90 days | Sn—7In—3Ag—0.5Cu | 2.83 | 67.04 | 7.9 | ○ | ○ |
| Executed Example 2 | 200° C./ 60 min | Sn—7In—3Ag—0.5Cu | 8.33 | 63.08 | 10.8 | ○ | ○ |
| Comparative Example 1 | 0 | Sn—7In—3Ag—0.5Cu | 2.75 | 69.11 | 7.2 | — | ○ |

TABLE 1-continued

| No. | Aging condition Temperature/time | Alloy composition | Yellowness (b*) | Lightness (L*) | Semi-quantitatively analyzed In (mass %) | Enrichment of In | Wettability |
|---|---|---|---|---|---|---|---|
| Comparative Example 2 | 200° C./ 120 min | Sn—7In—3Ag—0.5Cu | 15.59 | 48.00 | 13.1 | ○ | x |
| Comparative Example 3 | 200° C./ 180 min | Sn—7In—3Ag—0.5Cu | 24.40 | 32.19 | 14.9 | ○ | x |
| Comparative Example 4 | 200° C./ 240 min | Sn—7In—3Ag—0.5Cu | 24.45 | 33.45 | 15.4 | ○ | x |
| Comparative Example 5 | 200° C./ 300 min | Sn—7In—3Ag—0.5Cu | 22.77 | 36.90 | 18.3 | ○ | x |

In the Executed Example 1, the solder balls of Sn-7% by mass In-3% by mass Ag-0.5% by mass Cu were subjected to aging treatment involving continuous exposure to the atmosphere at normal temperature of 20° C. to 30° C. for 90 days. According to the Executed Example 1, when each solder ball having a yellowness (b*) of 2.83 and a lightness (L*) of 67.04 was selected, the semi-quantitative analysis value of In on the surface of the solder ball was 7.9% by mass. It was confirmed that the enrichment in the concentration of In was promoted, as compared with the case of the solder balls of the Comparative Example 1, which were not subjected to the aging treatment. It was also confirmed that, if the enrichment in the concentration of In (oxide film thickness) on the surface of the solder ball fell within a certain range, it was possible to well maintain the solder wettability and to suppress the growth of IMC.

In the Executed Example 2, the solder balls of Sn-7% by mass In-3% by mass Ag-0.5% by mass Cu were subjected to aging treatment involving continuous exposure to the atmosphere at 200° C. for 60 minutes. According to the Executed Example 2, when each solder ball having a yellowness (b*) of 8.33 and a lightness (L*) of 63.08 was selected, the semi-quantitative analysis value of In on the surface of the solder ball was 10.8% by mass, and it was confirmed that the enrichment in the concentration of In was promoted, as compared with the case of the solder balls of the Comparative Example 1, which were not subjected to aging treatment. It was also confirmed that, if the enrichment in the concentration of In (oxide film thickness) on the solder ball surface fell within a certain range, it was possible to well maintain the solder wettability and to suppress the growth of IMC.

In the Comparative Example 1, the solder balls of Sn-7% by mass In-3% by mass Ag-0.5% by mass Cu, which were not subjected to aging treatment, were used. In the Comparative Example 1, when each solder ball having a yellowness (b*) of 2.75 and a lightness (L*) of 69.11 was selected, the semi-quantitative analysis value of In on the surface of the solder ball was 7.2% by mass. In Table 1, the evaluation as to whether the concentration of In during joining in the Comparative Example 1 was enriched or not was expressed as "-" instead of "x" since the Comparative Example 1 in which aging treatment was not performed was used as the reference. The evaluation of the wettability of the solder balls was "○".

In the Comparative Example 2, the solder balls of Sn-7% by mass In-3% by mass Ag-0.5% by mass Cu were subjected to aging treatment involving continuous exposure to the atmosphere at 200° C. for 120 minutes. According to the Comparative Example 2, when each solder ball having a yellowness (b*) of 15.59 and a lightness (L*) of 48.00 was selected, the semi-quantitative analysis value of In on the surface of the solder ball was 13.1% by mass, and it was confirmed that the enrichment in the concentration of In was promoted, as compared with the case of the solder balls of the Comparative Example 1, which were not subjected to aging treatment. However, it was confirmed that the solder wettability decreased because the oxidized In became thicker in proportion to the enrichment in the concentration of In in the aging treatment.

In the Comparative Example 3, the solder balls of Sn-7% by mass In-3% by mass Ag-0.5% by mass Cu were subjected to aging treatment involving continuous exposure to the atmosphere at 200° C. for 180 minutes. According to the Comparative Example 3, when each solder ball having a yellowness (b*) of 24.40 and a lightness (L*) of 32.19 was selected, the semi-quantitative analysis value of In on the surface of the solder ball was 14.9% by mass, and it was confirmed that the enrichment in the concentration of In was promoted, as compared with the case of the solder balls of the Comparative Example 1, which were not subjected to aging treatment. However, it was confirmed that the solder wettability decreased because the oxidized In became thicker in proportion to the enrichment in the concentration of In in the aging treatment.

In the Comparative Example 4, the solder balls of Sn-7% by mass In-3% by mass Ag-0.5% by mass Cu were subjected to aging treatment involving continuous exposure to the atmosphere at 200° C. for 240 minutes. According to the Comparative Example 4, when each solder ball having a yellowness (b*) of 24.45 and a lightness (L*) of 33.45 was selected, the semi-quantitative analysis value of In on the surface of the solder ball was 15.4% by mass, and it was confirmed that the enrichment in the concentration of In was promoted, as compared with the case of the solder balls of the Comparative Example 1, which were not subjected to aging treatment. However, it was confirmed that the solder wettability decreased because the oxidized In became thicker in proportion to the enrichment in the concentration of In in the aging treatment.

In the Comparative Example 5, the solder balls of Sn-7% by mass In-3% by mass Ag-0.5% by mass Cu were subjected to aging treatment involving continuous exposure to the atmosphere at 200° C. for 300 minutes. According to the Comparative Example 5, when each solder ball having a yellowness (b*) of 22.77 and a lightness (L*) of 36.90 was selected, the semi-quantitative analysis value of In on the surface of the solder ball was 18.3% by mass, and it was confirmed that the enrichment in the concentration of In was promoted, as compared with the case of the solder balls of the Comparative Example 1, which were not subjected to aging treatment. However, it was confirmed that the solder wettability decreased because the oxidized In became thicker in proportion to the enrichment in the concentration of In in the aging treatment.

Table 2 indicates the measurement results and evaluation results when the alloy composition was Sn-1% by mass In-0.7% by mass Cu. The evaluation of the enrichment in the concentration of In in Table 2 was made based on the concentration of the solder ball, which was not subjected to aging treatment. In Table 2, the unit of In is mass %.

analysis value of In on the surface of the solder ball was 2.5% by mass, and it was confirmed that the enrichment in the concentration of In was promoted, as compared with the case of the solder balls of Comparative Example 6, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

TABLE 2

| No. | Aging condition Temperature/ time | Alloy composition | Yellowness (b*) | Lightness (L*) | Semi-quantitatively analyzed In (mass %) | Enrichment of In | Wettability |
| --- | --- | --- | --- | --- | --- | --- | --- |
| Executed Example 3 | Normal temperature/ 90 days | Sn—1In—0.7Cu | 3.01 | 67.37 | 2.1 | ○ | ○ |
| Executed Example 4 | 200° C./ 60 min | Sn—1In—0.7Cu | 4.47 | 67.33 | 2.2 | ○ | ○ |
| Executed Example 5 | 200° C./ 120 min | Sn—1In—0.7Cu | 6.20 | 67.16 | 2.5 | ○ | ○ |
| Executed Example 6 | 200° C./ 180 min | Sn—1In—0.7Cu | 10.23 | 65.34 | 2.7 | ○ | ○ |
| Executed Example 7 | 200° C./ 240 min | Sn—1In—0.7Cu | 12.66 | 62.15 | 2.8 | ○ | ○ |
| Comparative Example 6 | 0 | Sn—1In—0.7Cu | 2.79 | 69.30 | 1.2 | — | ○ |
| Comparative Example 7 | 200° C./ 300 min | Sn—1In—0.7Cu | 15.30 | 59.89 | 3.0 | ○ | x |

In the Executed Example 3, the solder balls of Sn-1% by mass In-0.7% by mass Cu were subjected to aging treatment involving continuous exposure to the atmosphere at normal temperature of 20° C. to 30° C. for 90 days. According to the Executed Example 3, when each solder ball having a yellowness (b*) of 3.01 and a lightness (L*) of 67.37 was selected, the semi-quantitative analysis value of In on the surface of the solder ball was 2.1% by mass, and it was confirmed that the enrichment in the concentration of In was promoted, as compared with the case of the solder balls of the Comparative Example 6, which was not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Executed Example 4, the solder balls of Sn-1% by mass In-0.7% by mass Cu were subjected to aging treatment involving continuous exposure to the atmosphere at 200° C. for 60 minutes. According to the Executed Example 4, when each solder ball having a yellowness (b*) of 4.47 and a lightness (L*) of 67.33 was selected, the semi-quantitative analysis value of In on the surface of the solder ball was 2.2% by mass, and it was confirmed that the enrichment in the concentration of In was promoted, as compared with the case of the solder balls of Comparative Example 6, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Executed Example 5, the solder balls of Sn-1% by mass In-0.7% by mass Cu were subjected to aging treatment involving continuous exposure to the atmosphere at 200° C. for 120 minutes. According to the Executed Example 5, when each solder ball having a yellowness (b*) of 6.20 and a lightness (L*) of 67.16 was selected, the semi-quantitative In the Executed Example 6, the solder balls of Sn-1% by mass In-0.7% by mass Cu were subjected to aging treatment involving continuous exposure to the atmosphere at 200° C. for 180 minutes. According to the Executed Example 6, when each solder ball having a yellowness (b*) of 10.23 and a lightness (L*) of 65.34 was selected, the semi-quantitative analysis value of In on the surface of the solder ball was 2.7% by mass, and it was confirmed that the enrichment in the concentration of In was promoted, as compared with the case of the solder balls of Comparative Example 6, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Executed Example 7, the solder balls of Sn-1% by mass In-0.7% by mass Cu were subjected to aging treatment involving continuous exposure to the atmosphere at 200° C. for 240 minutes. According to the Executed Example 7, when each solder ball having a yellowness (b*) of 12.66 and a lightness (L*) of 62.15 was selected, the semi-quantitative analysis value of In on the surface of the solder ball was 2.8% by mass, and it was confirmed that the enrichment in the concentration of In was promoted, as compared with the case of the solder balls of Comparative Example 6, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Comparative Example 6, the solder balls of Sn-1% by mass In-0.7% by mass Cu, which were not subjected to aging treatment, were used. In the Comparative Example 6, when each solder ball having a yellowness (b*) of 2.79 and a lightness (L*) of 69.30 was selected, the semi-quantitative analysis value of In on the surface of the solder ball was 1.2% by mass. In Table 2, the evaluation as to whether the concentration of In during joining in the Comparative Example 6 was enriched or not is expressed as "-" instead of "x" since the Comparative Example 6 in which aging treatment was not performed was used as the reference. The evaluation of the wettability of the solder balls was "∘".

In the Comparative Example 7, the solder balls of Sn-1% by mass In-0.7% by mass Cu were subjected to aging treatment involving continuous exposure to the atmosphere at 200° C. for 300 minutes. According to the Comparative Example 7, when each solder ball having a yellowness (b*) of 15.30 and a lightness (L*) of 59.89 was selected, the semi-quantitative analysis value of In on the surface of the solder ball was 3.0% by mass, and it was confirmed that the enrichment in the concentration of In was promoted, as compared with the case of the solder balls of Comparative Example 6, which were not subjected to aging treatment. However, it was confirmed that the solder wettability decreased because the oxidized In became thicker in proportion to the enrichment in the concentration of In in the aging treatment.

Table 3 indicates the measurement results and evaluation results when the alloy composition was Sn-1% by mass In-0.1% by mass Bi-0.001% by mass Ni-0.7% by mass Cu. The evaluation of the enrichment in the concentration of In in Table 3 was made based on the concentration of the solder ball, which was not subjected to aging treatment. In Table 3, the unit of In is mass %.

TABLE 3

| No. | Aging condtion Temperature/ time | Alloy composition | Yellowness (b*) | Lightness (L*) | Semi-quantitatively analyzed In (mass %) | Enrichment of In | Wettability |
|---|---|---|---|---|---|---|---|
| Executed Example 8 | 200° C./ 60 min | Sn—1In—0.1Bi—0.001Ni—0.7Cu | 4.61 | 64.22 | 2.0 | ∘ | ∘ |
| Comparative Example 8 | 0 | Sn—1In—0.1Bi—0.001Ni—0.7Cu | 2.79 | 68.76 | 0.9 | — | ∘ |

In the Executed Example 8, the solder balls of Sn-1% by mass In-0.1% by mass Bi-0.001% by mass Ni-0.7% by mass Cu were subjected to aging treatment involving continuous exposure to the atmosphere at 200° C. for 60 minutes. According to the Executed Example 8, when each solder ball having a yellowness (b*) of 4.61 and a lightness (L*) of 64.22 was selected, the semi-quantitative analysis value of In on the surface of the solder ball was 2.0% by mass, and it was confirmed that the enrichment in the concentration of In was promoted, as compared with the case of the solder balls of the Comparative Example 1, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Comparative Example 8, the solder balls of Sn-1% by mass In-0.1% by mass Bi-0.001% by mass Ni-0.7% by mass Cu, which were not subjected to aging treatment, were used. In the Comparative Example 8, when each solder ball having a yellowness (b*) of 2.79 and a lightness (L*) of 68.76 was selected, the semi-quantitative analysis value of In on the surface of the solder ball was 0.9% by mass. In Table 3, the evaluation as to whether the concentration of In during joining in the Comparative Example 1 was enriched or not was expressed as "-" instead of "x" since the Comparative Example 1 in which aging treatment was not performed was used as the reference. The evaluation of the wettability of the solder balls was "∘".

Table 4 indicates the measurement results and evaluation results when the alloy composition was Sn-1% by mass In-0.1% by mass Sb-0.001% by mass Co-0.7% by mass Cu. The evaluation of the enrichment in the concentration of In in Table 4 was made based on the concentration of the solder ball, which was not subjected to aging treatment. In Table 4, the unit of In is mass %.

TABLE 4

| No. | Aging condition Temperature/time | Alloy composition | Yellowness (b*) | Lightness (L*) | Semi-quantitatively analyzed In (mass %) | Enrichment of In | Wettability |
|---|---|---|---|---|---|---|---|
| Executed Example 9 | 200° C./60 min | Sn—1In—0.1Sb—0.001Co—0.7Cu | 4.55 | 63.81 | 2.5 | ○ | ○ |
| Comparative Example 9 | 0 | Sn—1In—0.1Sb—0.001Co—0.7Cu | 2.76 | 67.21 | 1.5 | — | ○ |

In the Executed Example 9, the solder balls of Sn-1% by mass In-0.1% by mass Sb-0.001% by mass Co-0.7% by mass Cu were subjected to aging treatment involving continuous exposure to the atmosphere at 200° C. for 60 minutes. According to the Executed Example 9, when each solder ball having a yellowness (b*) of 4.55 and a lightness (L*) of 63.81 was selected, the semi-quantitative analysis value of In on the surface of the solder ball was 2.5% by mass, and it was confirmed that the enrichment in the concentration of In was promoted, as compared with the case of the solder balls of the Comparative Example 9, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Comparative Example 9, the solder balls of Sn-1% by mass In-0.1% by mass Sb-0.001% by mass Co-0.7% by mass Cu, which were not subjected to aging treatment, were used. In the Comparative Example 9, when each solder ball having a yellowness (b*) of 2.76 and a lightness (L*) of 67.21 was selected, the semi-quantitative analysis value of In on the surface of the solder ball was 1.5% by mass. In Table 4, the evaluation as to whether the concentration of In during joining in the Comparative Example 9 was enriched or not was expressed as "-" instead of "x" since the Comparative Example 9 in which aging treatment was not performed was used as the reference. The evaluation of the wettability of the solder balls was "○".

Table 5 indicates the measurement results and evaluation results when the alloy composition was Sn-0.1% by mass In-0.7% by mass Cu. The evaluation of the enrichment in the concentration of In in Table 5 was made based on the concentration of the solder ball, which was not subjected to aging treatment. In Table 5, the unit of In is mass %.

In the Executed Example 10, the solder balls of Sn-0.1% by mass In-0.7% by mass Cu were subjected to aging treatment involving continuous exposure to the atmosphere at 200° C. for 60 minutes. According to the Executed Example 10, when each solder ball having a yellowness (b*) of 4.08 and a lightness (L*) of 67.35 was selected, the semi-quantitative analysis value of In on the surface of the solder ball was 0.3% by mass, and it was confirmed that the concentration of In was increased, as compared with the case of the solder balls of Comparative Example 10, which were not subjected to aging treatment. It was also confirmed that, if the enrichment in the concentration of In (oxide film thickness) on the surface of the solder ball fell within a certain range, it was possible to well maintain the solder wettability and to suppress the growth of IMC.

In the Comparative Example 10, the solder balls of Sn-0.1% by mass In-0.7% by mass Cu, which were not subjected to aging treatment, were used. In the Comparative Example 10, when each solder ball having a yellowness (b*) of 2.65 and a lightness (L*) of 70.11 was selected, the semi-quantitative analysis value of In on the surface of the solder ball was 0.1% by mass. In Table 5, the evaluation as to whether the concentration of In during joining in the Comparative Example 10 was enriched or not is expressed as "-" instead of "x" since the Comparative Example 10 in which aging treatment was not performed was used as the reference. The evaluation of the wettability of the solder balls was "○".

From the above results, it was confirmed that, in the case of a solder ball having an In content of more than 0% by mass and 10% by mass or less and a spherical diameter of 120 μm or less, aging treatment was performed to produce a solder ball having a yellowness (b*) of 2.8 or more and 15.0 or less, whereby the concentration of In was remarkably enriched on the surface of the solder ball. It was also confirmed that, as a result, the oxide film containing indium oxide such as $In_2O_3$, which was formed on the surface of the solder ball, functioned as a protective film, whereby the solder wettability during solder joining may be ensured, as compared with a general solder ball, which was not subjected to aging treatment, and a solder ball subjected to aging treatment beyond certain conditions. However, a sol-

TABLE 5

| No. | Aging condition Temperature/time | Alloy composition | Yellowness (b*) | Lightness (L*) | Semi-quantitatively analyzed In (mass %) | Enrichment of In | Wettability |
|---|---|---|---|---|---|---|---|
| Executed Example 10 | 200° C./60 min | Sn—0.1In—0.7Cu | 4.08 | 67.35 | 0.3 | ○ | ○ |
| Comparative Example 10 | 0 | Sn—0.1In—0.7Cu | 2.65 | 70.11 | 0.1 | — | ○ | der ball including 3% by mass of Ag, 0.5% by mass of Cu, 0.2% by mass of In and a remainder of Sn is excluded from the invention.

The technical scope of the present invention is not limited to the above-described embodiments, and includes any various kinds of modifications or alterations to the above-described embodiments without departing from the scope of the present invention.

What is claimed is:

1. A solder ball comprising:
   0.1% by mass or more and 10% by mass or less of In; and
   a remainder of Sn,
   wherein the solder ball has a yellowness (b*) in an L*a*b* color system of 2.8 or more and 15.0 or less and a lightness (L*) in the L*a*b* color system of 60 or more and 100 or less, and
   wherein the solder ball further includes at least one element selected from a group consisting of:
      0% by mass or more and 4% by mass or less of Ag;
      0% by mass or more and 1.0% by mass or less of Cu;
      0% to 3% by mass in total of an element selected from a group consisting of Bi and Sb; and
      0% to 0.1% by mass in total of an element selected from a group consisting of Ni, Co, Fe, Ge, and P,
   provided that a solder ball including 3% by mass of Ag, 0.5% by mass of Cu, 0.2% by mass of In and a remainder of Sn is excluded.

2. The solder ball according to claim 1, wherein a content of the In is 0.1% by mass or more and 7% by mass or less.

3. The solder ball according to claim 1, wherein the solder ball has a spherical diameter of 0.1 μm or more and 120 μm or less.

4. The solder ball according to claim 2, wherein the solder ball has a spherical diameter of 0.1 μm or more and 120 μm or less.

5. A solder joint comprising the solder ball according to claim 1.

6. A joining method comprising the steps of:
   arranging a plurality of the solder balls according to claim 1 on electrodes; and
   melting the plurality of solder balls arranged on the electrodes using organic acid gas.

* * * * *

UNITED STATES PATENT AND TRADEMARK OFFICE
CERTIFICATE OF CORRECTION

PATENT NO. : 10,780,531 B2  
APPLICATION NO. : 16/677011  
DATED : September 22, 2020  
INVENTOR(S) : Hiroyoshi Kawasaki Page 1 of 1

It is certified that error appears in the above-identified patent and that said Letters Patent is hereby corrected as shown below:

In the Claims

Column 16, Line 3, Claim 1, delete "provided that a" and insert -- wherein the --

Column 16, Line 3, Claim 1, delete "including" and insert -- cannot include --

Column 16, Line 5, Claim 1, delete "Sn is excluded." and insert -- Sn. --

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*